United States Patent
Chang et al.

(10) Patent No.: US 11,087,994 B2
(45) Date of Patent: *Aug. 10, 2021

(54) VIA CONNECTION TO A PARTIALLY FILLED TRENCH

(71) Applicant: Taiwan Semiconductor Manufacturing Company, Ltd., Hsin-Chu (TW)

(72) Inventors: Shih-Ming Chang, Zhubei (TW); Chih-Ming Lai, Hsinchu (TW); Ru-Gun Liu, Zhubei (TW); Tsai-Sheng Gau, HsinChu (TW); Chung-Ju Lee, Hsinchu (TW); Tien-I Bao, Dayuan Township (TW); Shau-Lin Shue, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/717,461

(22) Filed: Dec. 17, 2019

(65) Prior Publication Data

US 2020/0152476 A1     May 14, 2020

Related U.S. Application Data

(60) Continuation of application No. 15/912,177, filed on Mar. 5, 2018, now Pat. No. 10,515,823, which is a division of application No. 14/970,242, filed on Dec. 15, 2015, now Pat. No. 9,911,623.

(51) Int. Cl.
| | | |
|---|---|---|
| *H01L 21/321* | (2006.01) | |
| *H01L 21/768* | (2006.01) | |
| *H01L 21/311* | (2006.01) | |
| *H01L 21/3105* | (2006.01) | |
| *H01L 23/522* | (2006.01) | |

(52) U.S. Cl.
CPC .... *H01L 21/3212* (2013.01); *H01L 21/31055* (2013.01); *H01L 21/31111* (2013.01); *H01L 21/7684* (2013.01); *H01L 21/76807* (2013.01); *H01L 21/76808* (2013.01); *H01L 21/76877* (2013.01); *H01L 21/76885* (2013.01); *H01L 21/76897* (2013.01); *H01L 23/5226* (2013.01); *H01L 21/76834* (2013.01); *H01L 21/76883* (2013.01); *H01L 2221/1063* (2013.01)

(58) Field of Classification Search
CPC ..................... H01L 21/76808; H01L 23/5226
See application file for complete search history.

(56) References Cited

U.S. PATENT DOCUMENTS

| | | | |
|---|---|---|---|
| 7,564,115 | B2 | 7/2009 | Chen et al. |
| 7,633,165 | B2 | 12/2009 | Hsu et al. |
| 7,803,704 | B2 | 9/2010 | Zhang et al. |
| 7,825,024 | B2 | 11/2010 | Lin et al. |
| 7,973,413 | B2 | 7/2011 | Kuo et al. |

(Continued)

*Primary Examiner* — Stephen M Bradley
(74) *Attorney, Agent, or Firm* — Haynes and Boone, LLP

(57) ABSTRACT

An integrated circuit structure includes a first metal feature formed into a first dielectric layer, a second metal feature formed into a second dielectric layer, the second dielectric layer being disposed on said first dielectric layer, and a via connecting the first metal feature to the second metal feature, wherein a top portion of the via is offset from a bottom portion of the via.

20 Claims, 11 Drawing Sheets

(56) References Cited

U.S. PATENT DOCUMENTS

| | | |
|---|---|---|
| 8,105,875 B1 | 1/2012 | Hu et al. |
| 8,158,456 B2 | 4/2012 | Chen et al. |
| 8,183,578 B2 | 5/2012 | Wang |
| 8,183,579 B2 | 5/2012 | Wang |
| 8,227,902 B2 | 7/2012 | Kuo |
| 8,278,152 B2 | 10/2012 | Liu et al. |
| 8,426,961 B2 | 4/2013 | Shih et al. |
| 8,664,113 B2 * | 3/2014 | Kim .................... H01L 23/5384 |
| | | 438/637 |
| 8,669,174 B2 | 3/2014 | Wu et al. |
| 8,802,504 B1 | 8/2014 | Hou et al. |
| 10,515,823 B2 * | 12/2019 | Chang ............... H01L 21/31111 |
| 2004/0000721 A1 | 1/2004 | Cooney, III et al. |
| 2006/0216929 A1 | 9/2006 | Park et al. |
| 2006/0226549 A1 | 10/2006 | Yu et al. |
| 2007/0037385 A1 | 2/2007 | Huebinger |
| 2007/0111508 A1 | 5/2007 | Hayashi et al. |
| 2014/0001645 A1 | 1/2014 | Lin et al. |
| 2014/0117558 A1 | 5/2014 | Boyanov |
| 2014/0225258 A1 | 8/2014 | Chiu et al. |
| 2014/0252572 A1 | 9/2014 | Hou et al. |
| 2015/0076695 A1 | 3/2015 | Cheng et al. |
| 2015/0179578 A1 | 6/2015 | Jezewski et al. |
| 2016/0254181 A1 | 9/2016 | Padhi et al. |
| 2016/0260666 A1 | 9/2016 | Wei et al. |
| 2016/0276267 A1 | 9/2016 | Lee et al. |
| 2017/0037385 A1 | 2/2017 | Birikh |
| 2017/0170110 A1 | 6/2017 | Chang et al. |

* cited by examiner

VIA CONNECTION TO A PARTIALLY FILLED TRENCH

PRIORITY INFORMATION

The present application is a continuation of U.S. patent application Ser. No. 15/912,177 filed Mar. 5, 2018, which is a divisional of U.S. patent application Ser. No. 14/970,242 filed Dec. 15, 2015, each of which is hereby incorporated by reference in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

One aspect of forming integrated circuits is forming small vertical metal lines to connect one layer of horizontal metal lines to a different layer of horizontal metal lines. Such vertical metal lines are typically referred to as vias. Due to the small nature of integrated circuits, aligning the pattern of vias to the previously applied layers can be difficult. For example, when fabricating vias, it is important that the pattern used to form the vias is appropriately aligned such that the vias connect to the appropriate metal lines. Even if a via makes contact with the appropriate underlying metal line, a slight misalignment may cause the via to be too close to a neighboring metal line. To avoid this issue, it is desirable to use processing methods to form vias that are better aligned and do not come too close to lines to which they are not intended to contact.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
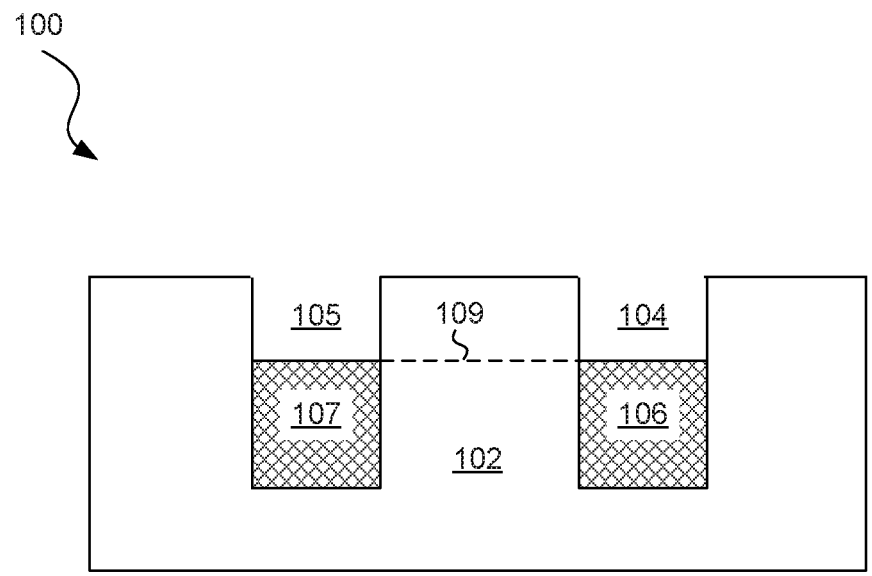
FIGS. 1A-1L are diagrams showing an illustrative process for forming a via that connects to a metal line in a partially filled trench, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, it is desirable to form a via such that it makes good contact with the appropriate metal line and does not come too close to a neighboring metal line to which it is not intended to contact. According to principles described herein, the metal lines of an underlying metal layer are formed as partially filled trenches. In other words, the trenches are only partially filled with a conductive material such as a metal material. Thus, if there is misalignment between a via and a metal line, there is an additional vertical distance to separate the via from a neighboring metal line.

FIGS. 1A-1L are diagrams showing an illustrative process for forming an integrated circuit (IC) structure 100 that includes an interconnection structure formed on a semiconductor substrate (not shown) and designed to connect various devices to form an integrated circuit. In some embodiments, the semiconductor substrate is a silicon substrate. In some embodiments, the semiconductor substrate may alternatively or additionally include other semiconductor materials, such as germanium, silicon germanium, gallium arsenic or other suitable semiconductor material. In some embodiments, the semiconductor substrate may additionally include an embedded dielectric material layer to provide proper isolation function. The interconnection structure includes metal lines in a plurality of metal layers, which are vertically connected through via features. In the present embodiment for illustration, the IC structure 100 includes a via that connects to a conductive line such as a metal line in a partially filled trench.

FIG. 1A is a cross-sectional view of two conductive lines such as metal lines 106, 107. The two metal lines 106, 107 may be part of a metal pattern, in one metal layer (such as metal one or metal two), formed into a dielectric layer such as an Interlayer Dielectric (ILD) layer. According to the present example, a first trench 104 and a second trench 105 are formed into a first Interlayer Dielectric (ILD) 102. The first trench 104 is partially filled with a metal material such as a metal material to form a first metal line 106 and the second trench 105 is partially filled with the metal material to form a second metal line 107. The top surfaces of both metal lines 106, 107 are coplanar along plane 109. The first and second metal lines may include multiple films. In some embodiments, the metal lines (106 and 107) include a barrier layer formed on sidewalls of the trenches. In furtherance of the embodiments, the metal lines (106 and 107) include a bulk metal formed on the barrier layer and filled in the trenches. In some examples, the barrier layer includes titanium nitride, tantalum nitride, or other suitable material. In some examples, the bulk material includes copper or other suitable metal or metal alloy.

The ILD 102 may be formed on top of a semiconductor substrate (not shown), such as semiconductor wafer. The semiconductor substrate may include a variety of circuit devices such as transistors formed thereon. Such circuit elements are formed during the front-end of line. In some cases, the interconnection structure is formed on the circuit devices during the back-end of line. The interconnection structure includes horizontal metal lines in multiple metal layers. The metal lines in different metal layers are connected to each other through use of vertical conductive lines referred to as vias. FIG. 1A illustrates a portion of one such metal layer of metal lines within the ILD 102.

The ILD 102 may be formed of any suitable dielectric material. In some embodiments, the ILD 102 includes silicon oxide, fluorinated silica glass (FSG), organosilicate glass (OSG), carbon doped silicon oxide, Xerogel, Aerogel, amorphous fluorinated carbon, polyimide, porous material and/or other materials. The ILD 102 may be made of a material that is selected for its etching selectivity. For example, it may be desirable that some etching processes will have little effect on the ILD 102 as will be described in further detail below. In some other examples, the ILD 102 may further include an etch stop layer of different dielectric material to provide etch selectivity.

The partially filled trenches 104, 105 may be formed in a variety of manners. In some embodiments, the metal lines (such as 106 and 107) of the metal layer are formed by a damascene process. A patterning process that includes photolithography is used to form the trenches. Specifically, a photoresist is applied, exposed, and developed. An etching process is then applied to transfer the pattern within the photoresist to the ILD 102 to form the trenches. In some example, a hard mask may be used such that the trench pattern is first transferred to the hard mask from the patterned resist layer and is further transferred from the hard mask to the ILD 102. Afterward, a metal material, such as a metal material, is deposited into the trenches 104, 105. Such a deposition may overfill the trenches. Thus, a Chemical-Mechanical Polishing (CMP) process may be applied to remove the excess metal material and expose the ILD 102. This leaves fully filled trenches. Then, an etching process is applied to partially recess the metal material to form the partially filled trenches 104, 105. Such an etching process can be selected so that it effectively removes the metal material while leaving the ILD 102 substantially intact.

Other methods can be used to form the partially filled trenches. In one example, instead of recessing the metal material, additional ILD material or other suitable dielectric material may be deposited in regions not corresponding to metal features, such as by a self-aligned growth. Other methods are contemplated as well.

Figure 1B:
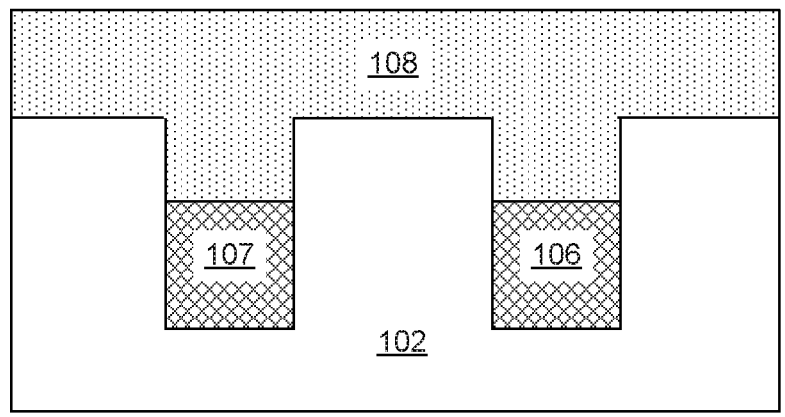

FIG. 1B is a diagram showing deposition of a sacrificial material 108. The sacrificial material 108 may be selected to be a material that is easily removed through certain etching processes such as a wet etching process. The sacrificial material may also be selected to be a low cost material. In some embodiments, a polymeric material is used as the sacrificial material to fill in the trenches by a proper technique, such as spin-on coating.

Figure 1C:
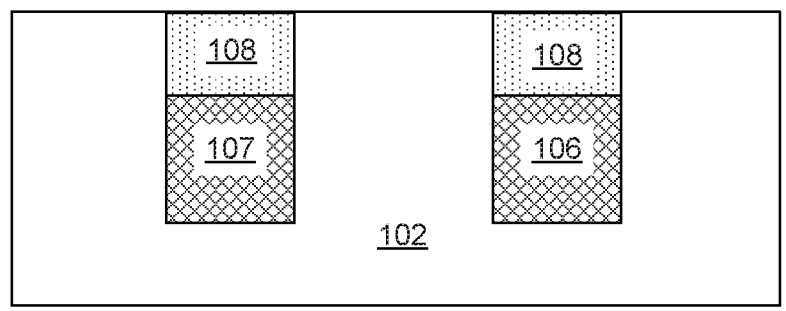

FIG. 1C is a diagram showing an illustrative CMP process 110 that is used to remove the sacrificial material 108 above the surface of the ILD 102, thus exposing the first ILD 102. This leaves the sacrificial material 108 within the upper portions of the trenches 104, 105. Other process, such as etch back, may be alternatively used to remove the sacrificial material 108 above the surface of the ILD 102.

Figure 1D:
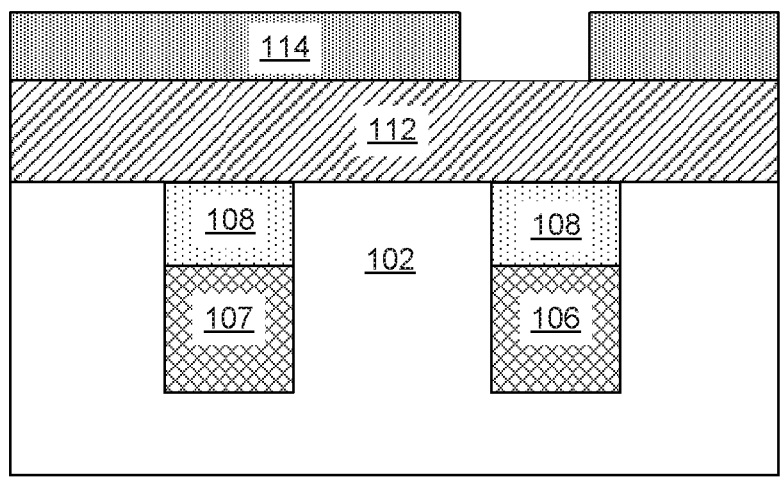

FIG. 1D illustrates the deposition of a buffer layer 112 on the first ILD 102. In some embodiments, the buffer layer 112 includes a dielectric material different from the ILD 102 such that the subsequent etching process is able to selectively etch the buffer layer without etching the ILD 102. In some examples, the buffer layer includes dielectric material, such as silicon nitride or silicon carbide, formed on the ILD 102 by a proper technique, such as chemical vapor deposition (CVD). A photoresist 114 is then formed on the buffer layer 112. FIG. 1D illustrates the photoresist 114 as being patterned. Standard lithographic processes may be used to pattern the photoresist. For example, the photoresist may be exposed to a light source through use of a patterned photomask. The photoresist is then developed to remove certain portions of the photoresist.

Figure 1E:
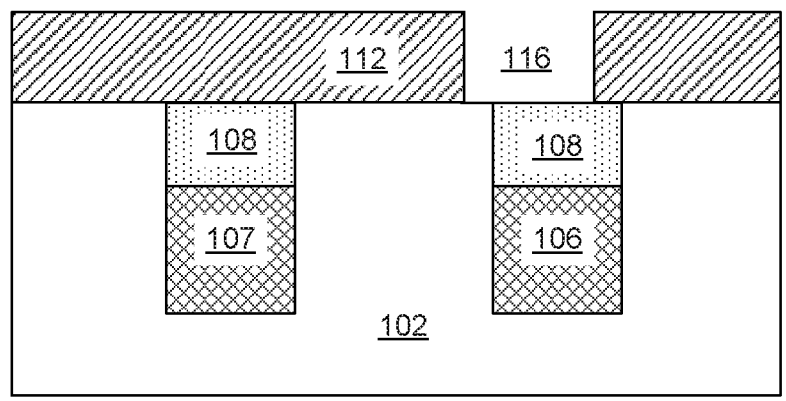

FIG. 1E illustrates the IC structure after the pattern in the photoresist has been transferred to the buffer layer 112. Specifically, an etching process may be used to etch the exposed portion of the buffer layer 112 within the opening of the buffer layer 112. Thus, the pattern in the photomask is transferred to the buffer layer to form an opening (hole) 116 in the buffer layer 112 and expose the sacrificial material 108 over metal line 106. The opening 116 corresponds to a location at which a via is to be formed to connect the metal line 106 to a metal line of an overlying metal layer. In one example, an anisotropic etching process such as a dry etching process is used to form the opening 116 in the buffer layer 112. A dry etching process often uses a bombardment of ions and chemical reaction to remove certain types of material. Afterward, the photoresist is removed by a suitable process, such as wet stripping or plasma ashing.

Figure 1F:
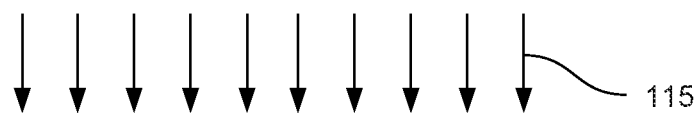
Figure 1F:
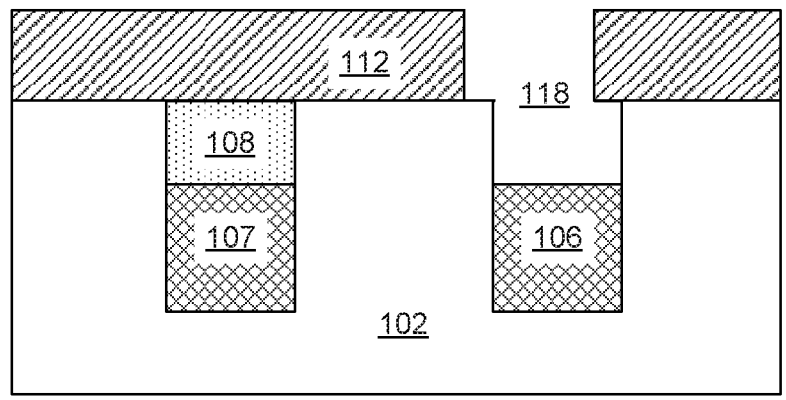

FIG. 1F illustrates an etching process 115 that is used to remove the sacrificial material 108 that is exposed through the hole 116. This creates a hole 118 extending down to the metal line 106. The etching process may be an isotropic process such as a wet etching process. A wet etching process uses chemical etchants to remove certain types of material. The etching process 115 is designed to selectively remove the sacrificial material 108 while leaving the first ILD 102 and the buffer layer 112 substantially intact.

Figure 1G:
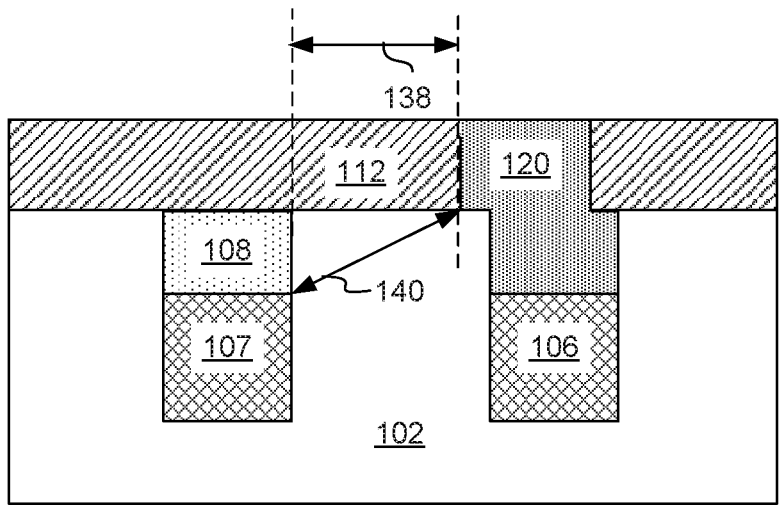

FIG. 1G illustrates a conductive feature 120 such as a metal via formed within the hole 118. The metal via 120 may be formed by depositing a metal material on the surface of the wafer, and then performing a CMP process to expose the top of the buffer layer 112. This leaves the metal material within the hole 118 to form the via 120 and any other vias in the circuit. In some embodiments, copper or tungsten may be used to fill in the hole 118 to form the metal via 120. In furtherance of the embodiments, copper may be filled in by a procedure that includes sputtering to form a copper seed layer and plating to form bulk copper in the hole 120. In some embodiments, a barrier layer, such as tantalum, tantalum nitride, titanium, titanium nitride, or a combination thereof, may be deposited on sidewalls of the hole 120 before filling in the metal.

In various embodiments, forming the metal via in such a manner provides a number of advantages. For example, it is possible that there will be a slight misalignment (between the metal line 106 and the overlying via) when patterning the via into the buffer layer 112. Without use of principles described herein, a slight misalignment may bring a via too close to a neighboring metal line 107. Specifically, distance 118 may be too close to metal line 107. Thus, the circuit would have to be designed with more space between metal lines to accommodate expected misalignment issues.

But, using principles described herein, the partially filled trench causes there to be an extra distance between the via and the neighboring metal line 107. Specifically, distance 120 includes both the horizontal distance and a vertical distance. Thus, using principles described herein, a circuit can be designed with the metal lines closer together.

Furthermore, the contact resistance between the metal line 106 and the overlying via is increased by the misalignment due to the contact area is reduced by the misalignment. By implementing the disclosed method, with misalignment, the metal via 120 includes two portions, the upper portion and the lower portion with an interface at the top surface of the ILD 102. The lower portion and upper portion have an offset from each other due to misalignment. The upper portion of the metal via 120 is above the ILD 102 and the lower portion is embedded in the ILD 102. The lower portion is self-aligned on the metal line 106, therefore the contact area is maximized and the contact resistance is minimized. Especially, the metal via 120 is above the metal lines 106 and 107.

Figure 1H:
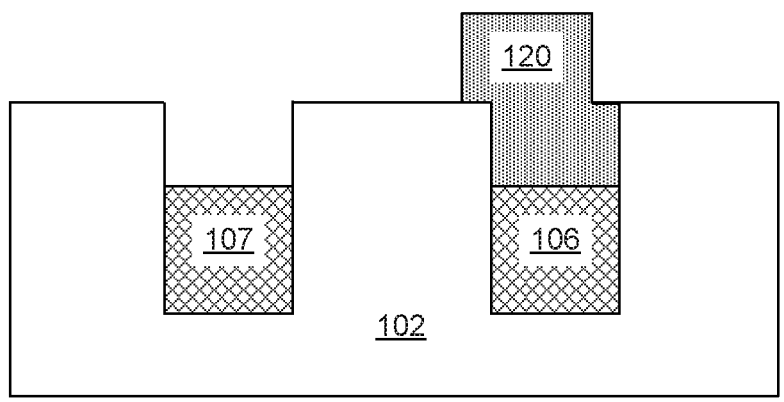

FIG. 1H illustrates a removal process to remove the buffer layer 112. In some examples, the sacrificial material 108 over the neighboring metal line 107 is removed as well. The removal process may include an etching process that is designed to remove the buffer layer 112 while leaving the first ILD 102 and the metal via 120 substantially intact.

Figure 1I:
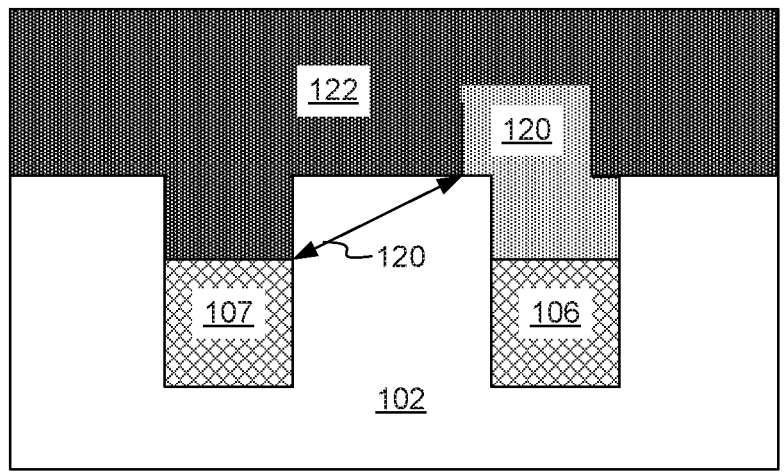

FIG. 1I illustrates formation of a second ILD 122 over the first ILD 102. In the present example, the second ILD 122 may be made of the same material as the first ILD 102. In some examples, however, the second ILD 122 may be different from the first ILD 102. The second ILD 122 is used to support a second metal layer and isolate the metal lines of the second metal layer. Thus, a set of metal lines may be formed into second ILD. Such metal lines are typically formed by forming trenches in the second ILD 122.

Figure 1J:
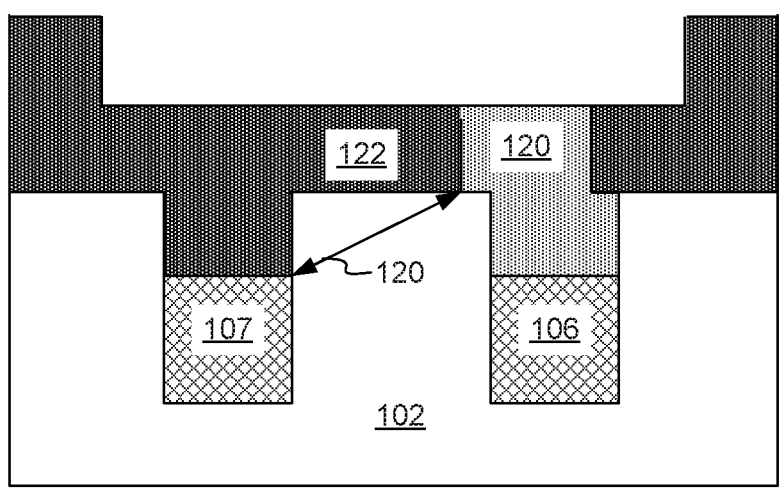

FIG. 1J illustrates the formation of a trench 123 within the second ILD 122. In the present example, the trench 123 is formed such that it runs perpendicular to the metal lines 106, 107 within the first ILD 102. The trench 123 is formed by a suitable procedure that includes lithography patterning and etching. The trench 123 exposes the via 120 so that when a metal material is formed within the trench 123, such metal is in direct contact with the via 120 and is thus electrically connected to the via 120.

Figure 1K:
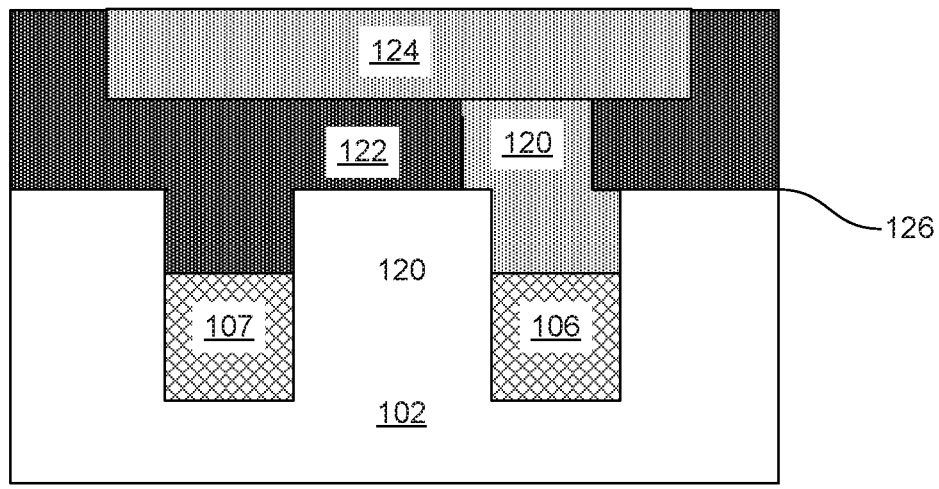

FIG. 1K illustrates a metal material formed within the trench 123 so as to form a metal line 124 within the second ILD 122. Thus, the metal line 124 within the second ILD 122 is connected to the metal line 107 within the first ILD 102. Using principles described herein, the via 120 is such that the upper portion of the via 120 is offset from the lower portion of the via 120 due to intrinsic misalignment. The offset is coplanar at the interface 126 between the first ILD 102 and the second ILD 122. In this example, the offset distance is less than the width of the via 120. The lower portion of the via 120 is self-aligned to the metal line. In some examples, if an additional metal layer is to be formed, then the metal line 124 may only partially fill the trench 123. Thus, the same techniques described above may be used to form the additional metal layer.

Figure 1L:
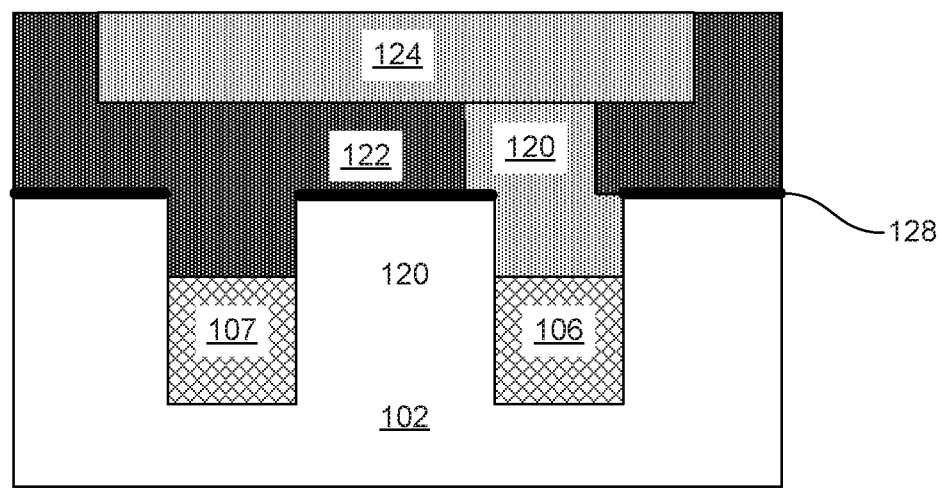

FIG. 1L illustrates an example in which an etch stop layer 128 is positioned between the first ILD 102 and the second ILD 122. In one example, the etch stop layer 128 is deposited after the first ILD 102 is formed and before the buffer layer 112 is deposited. The etch stop layer 128, however, may be applied at other appropriate times during the fabrication process. The etch stop layer 128 is used to prevent undesired etching of the first ILD layer. For example, when etching the second ILD 122 to pattern the second ILD 122, it is desirable not to etch the first ILD 102. The etch stop layer 128 is designed to be substantially unaffected by the etchant used to etch the second ILD 122.

Figure 2A:
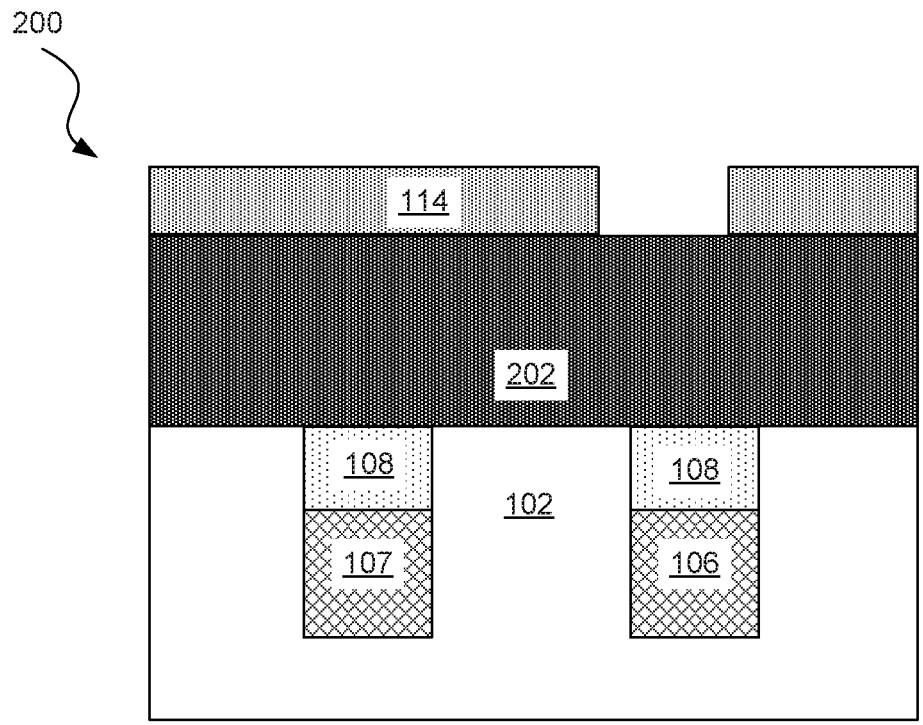
FIGS. 2A-2E are diagrams showing an illustrative process for forming a via that connects to a metal line in a partially filled trench using a dual damascene process, according to one example of principles described herein.

FIG. 2A-2E are diagrams showing an illustrative process for forming an IC structure 200 using a partially filled trench and a dual damascene process to form a conductive via that connects a metal line from the underlying metal layer to a metal line from overlying metal layer. Such a process is similar to the process described above except that the second ILD 202 is used in place of the buffer layer (e.g., 112, FIG. 1). FIG. 2A illustrates the second ILD 202 formed over the first ILD 202 before the conductive via is formed. Similar to the above process, a photoresist layer 114 is applied on top of the second ILD 202. Then, the photoresist 114 is patterned using various photolithographic processes.

Figure 2B:
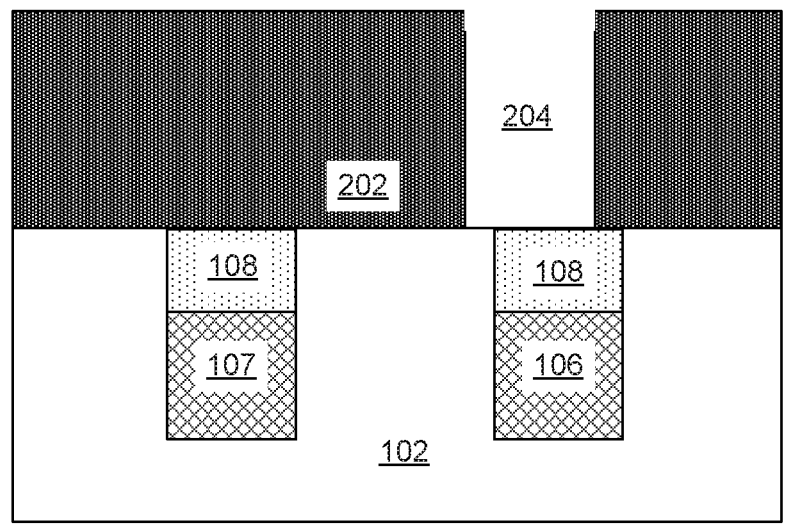

FIG. 2B illustrates the IC structure 200 after the pattern of the photoresist is transferred to the second ILD layer 202 to form a hole 204. The hole 204 extends all the way through the second ILD 202 to expose the first ILD 102 and the sacrificial material 108. In the present example, the second ILD 202 is made of a different material than the first ILD 102. More specifically, the different ILD materials are selected so as to have an etching selectivity to each other. That way, the etching process used to form the hole 204 does not substantially affect the first ILD 102. Afterward, the photoresist 114 may be removed by a proper technique, such as wet stripping or plasma ashing.

Figure 2C:
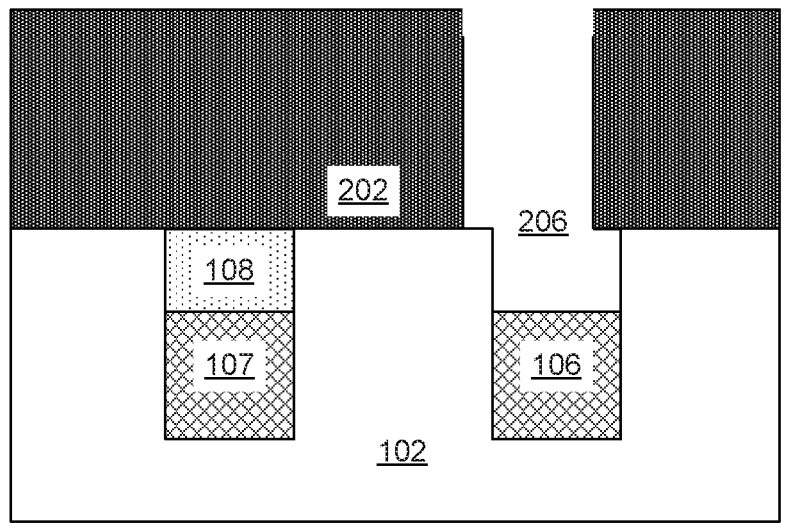

FIG. 2C illustrates removal of the sacrificial layer 108 using an etching process such as a wet etching process. This creates a hole 206 that extends from the top of the second ILD 202 to the top of the metal line 106. The etching process used to remove the sacrificial material 108 may be selected so that it effectively removes the sacrificial material while not substantially affecting the second ILD 202, the first ILD 102, or the metal line 106.

Figure 2D:
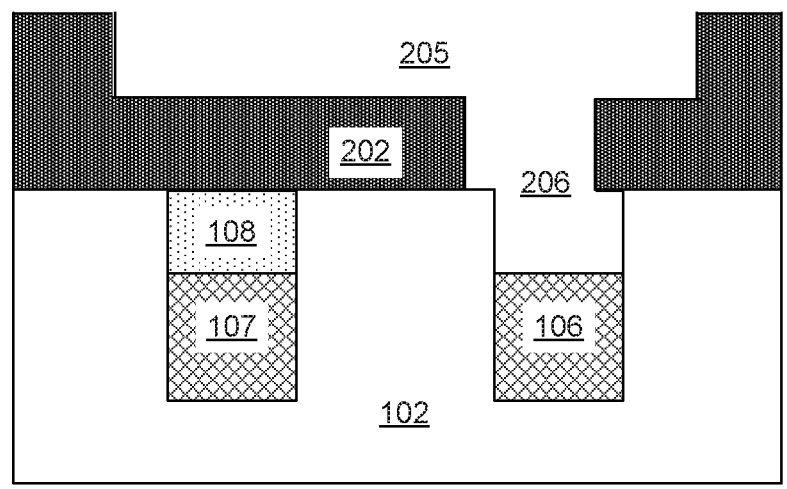

FIG. 2D illustrates formation of a trench 205 within the second ILD 202. In the present example, the trench runs perpendicular to the metal lines 106, 107. The trench 205 also intersects with the hole 206. That way, when the metal material is deposited, it will fill the trench 205 as well as the hole 206.

Figure 2E:
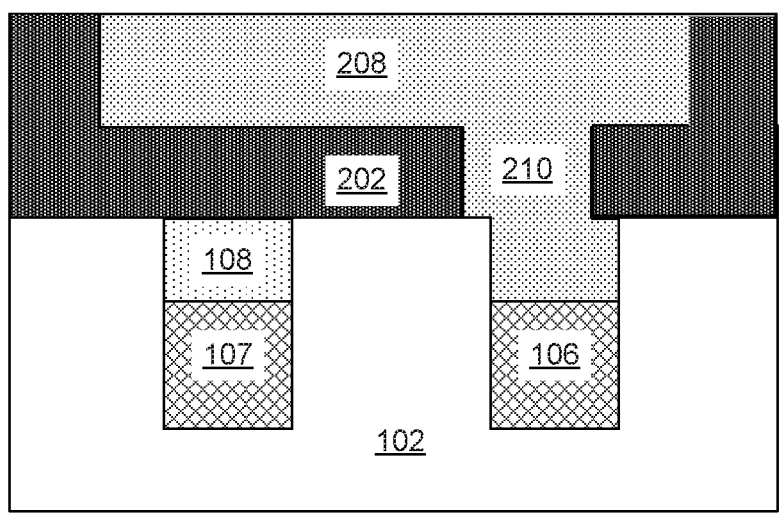

FIG. 2E illustrates such a deposition of metal to fill the trench 205. The deposited metal thus forms a metal line 208 and the conductive via 210. The metal line 208 may be one of several metal lines that form a metal pattern within the second ILD 202. The conductive via 210 provides an electrical connection between the metal line 106 of the underlying metal layer and the metal line 208 of the overlying metal layer. Because a single deposition of metal forms both vias and metal lines, it may be referred to as a dual damascene process. In some examples, if an additional metal layer is to be formed, then the metal line 208 may only partially fill the trench 205. Thus, the same techniques described above may be used to form the additional metal layer.

After forming the via 210 in the manner described above, the upper portion of the via 210 will be offset from the lower portion of the via 210. The offset distance is less than the width of the via 210. Additionally, the offset is coplanar with the interface between the first ILD 102 and the second ILD 202. In some examples, an etch stop layer may be used in a manner similar to the etch stop layer 128 described above in the text accompanying FIG. 1L.

Forming the via 210 in such a manner provides a number of advantages. For example, it is possible that there will be a slight misalignment when patterning the via 210 into the second ILD layer 202. Without use of principles described herein, a slight misalignment may bring a via too close to a neighboring metal line 107. Thus, the circuit would have to be designed with more space between metal lines to accommodate expected misalignment issues. But, using principles described herein, the partially filled trench causes there to be an extra distance between the via and the neighboring metal line 107. Specifically, such a distance includes both the horizontal distance and a vertical distance. Thus, using principles described herein, a circuit can be designed with the metal lines closer together.

Figure 3:
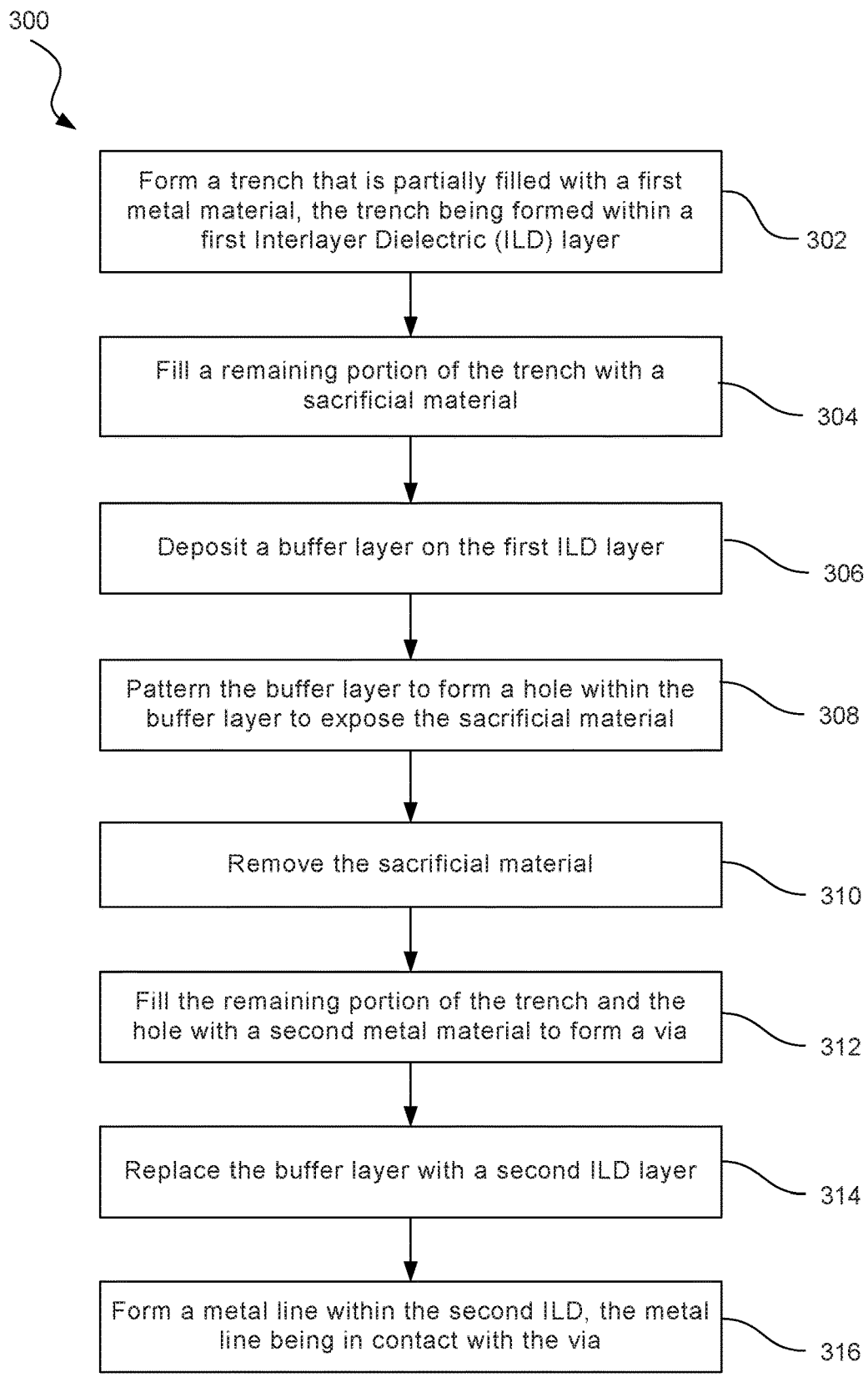
FIG. 3 is a flowchart showing an illustrative method for forming a via to a metal line in a partially filled trench through use of a buffer layer, according to one example of principles described herein.

FIG. 3 is a flowchart showing an illustrative method 300 for forming a via that connects to a metal line in a partially filled trench, the method utilizing a buffer layer. According to the present example, the method 300 includes a step 302 for forming a trench that is partially filled with a first metal material. The trench is formed within a first Interlayer Dielectric (ILD) layer. In one example, to form the partially filled trench, a patterning process that includes photolithography is. Specifically, a photoresist is applied, exposed, and developed. An etching process is then applied to transfer the pattern within the photoresist to the ILD to form the trench. Then, a metal material, such as a metal material, is deposited into the trench. Such a deposition may overfill the trenches. Thus, a Chemical-Mechanical Polishing (CMP) process may be applied to remove the excess metal material and expose the ILD. This results in a fully filled trench. Then, an etching process is applied to partially remove the metal material to form the partially filled trench.

The method 300 further includes a step 304 for filling a remaining portion of the trench with a sacrificial material. The sacrificial material may be a material that is low in cost and easily removable through a removal process such as a wet etching process.

The method 300 further includes a step 306 for depositing a buffer layer on the first ILD layer. The buffer layer is a temporary layer and is to be subsequently removed. The buffer layer is made of a material that can be selectively etched with respect to the first ILD layer.

The method 300 further includes a step 308 for patterning the buffer layer to form a hole within the buffer layer to expose the sacrificial material. This may be done through various fabrication processes including photolithography processes. Then, at step 310, the sacrificial material can be removed. In one example, a wet etching process is used to remove the sacrificial material. Removing the sacrificial material exposes the metal line that is formed within the partially filled trench.

The method 300 further includes a step 312 for filling the remaining portion of the trench and the hole with a second metal material to form a via. In one example, a CMP process is then applied to remove any excess metal material not within the hole and expose the top surface of the buffer layer. The via, however, remains in place.

The method 300 further includes a step 314 for replacing the buffer layer with a second ILD layer. This is done by first removing the buffer layer with an etching process. Such an etching process is designed to remove the buffer layer while leaving the first ILD and the via substantially intact. Then, the second ILD material is deposited. A CMP process can then be used to planarize the surface of the second ILD.

The method 300 further includes a step for forming a metal line within the second ILD. More generally, a metal pattern is formed within the second ILD. The metal pattern includes a metal line that contacts the via. In one example, to form the metal pattern, a set of trenches are formed into the second ILD. These trenches can extend to a depth sufficient to expose the top surface of the via. Thus, when the trenches are filled with a metal material to form a metal line, the metal line is in electrical connection with the via. The via thus connects an underlying metal line to an overlying metal line.

Figure 4:
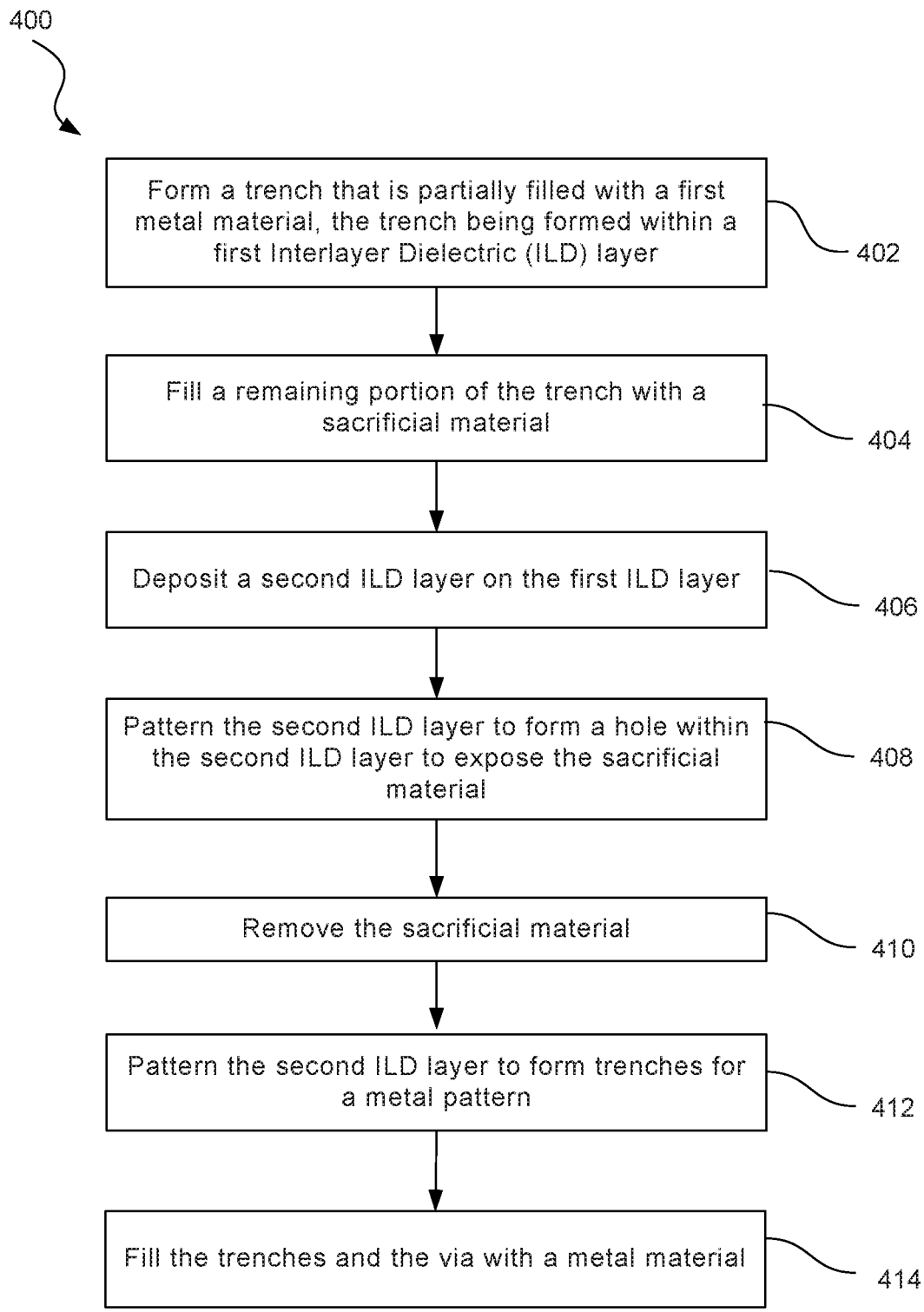
FIG. 4 is a flowchart showing an illustrative method for forming a via that connects to a metal line in a partially filled trench through use of a dual damascene process, according to one example of principles described herein.

FIG. 4 is a flowchart showing an illustrative method for forming a via that connects to a metal line in a partially filled trench through use of a dual damascene process. According to the present example, the method 400 includes a step 402 for forming a trench that is partially filled with a first metal material. The trench is formed within a first Interlayer Dielectric (ILD) layer. Such a partially filled trench may be formed in a manner as described above.

The method 400 further includes a step 404 for filling a remaining portion of the trench with a sacrificial material. The sacrificial material may be a material that is low in cost and easily removable through a removal process such as a wet etching process.

The method 400 further includes a step 406 for depositing a second ILD layer on the first ILD layer. The second ILD layer may be made of a different material than the first ILD so that the second ILD layer can be selectively etched with respect to the first ILD layer.

The method 400 further includes a step 408 for patterning the second ILD layer to form a hole within the second ILD layer. This exposes the sacrificial material. This may be done through various fabrication processes including photolithography processes. Then, at step 410, the sacrificial material can be removed. In one example, a wet etching process is used to remove the sacrificial material. Removing the sacrificial material exposes the metal line that is formed within the partially filled trench.

The method 400 further includes a step 412 for patterning the second ILD layer to form trenches for a metal pattern. At least one of the trenches intersects the hole that is formed into the second ILD layer. Thus, the hole will extend from the bottom of the trench down to the top surface of the metal line formed within the partially filled trench in the first ILD layer.

The method 400 further includes a step 414 for filling the trenches and the hole with a metal material. This forms a via within the hole and a metal line above the via in a single deposition process. Such a process is referred to as a dual damascene process. In some examples, a CMP process is applied to the top of the deposited metal to remove excess metal and expose the top surface of the second ILD.

The techniques described above describe a via between a first metal line in a first ILD to a second metal line in a second ILD. The methods and devices described above, however, may be applied to any two layers within a stack of layers. For example, it may be the case that there are 8 metal layers for a particular back-end portion of a circuit. Each of those layers may be formed using principles described herein such that the underlying layer is formed into a partially filled trench. That way, when the subsequent layer and vias are formed, the vias will have a greater distance between neighboring metal lines to which they are not intended to contact. Additionally, while the above description uses metal patterns, metal lines, and metal vias, it is understood that other conductive materials may be used in place of metal.

Forming vias in a manner as described in FIGS. 3 and 4 provides a number of advantages. For example, it is possible that there will be a slight misalignment when patterning the via into the buffer layer or second ILD layer. Without use of principles described herein, a slight misalignment may bring a via too close to a neighboring metal line. Thus, the circuit would have to be designed with more space between metal lines to accommodate expected misalignment issues. But, using principles described herein, the partially filled trench causes there to be an extra distance between the via and the neighboring metal line. Specifically, such a distance includes both the horizontal distance and a vertical distance. Thus, using principles described herein, a circuit can be designed with the metal lines closer together.

According to one example, a method includes forming a trench that is partially filled with a first metal material, the trench being formed within a first Interlayer Dielectric (ILD) layer, filling a remaining portion of the trench with a sacrificial material, depositing a buffer layer on the first ILD layer, patterning the buffer layer to form a hole within the buffer layer to expose the sacrificial material, and removing the sacrificial material.

According to one example, a method includes forming a trench that is partially filled with a first metal material, the trench being formed within a first Interlayer Dielectric (ILD) layer, filling a remaining portion of the trench with a sacrificial material, depositing a second ILD layer on the first ILD layer, patterning the second ILD layer to form a hole within the second ILD layer to expose the sacrificial material, and removing the sacrificial material.

According to one example, a semiconductor device includes a first metal pattern formed into a first dielectric layer, the first metal pattern comprising a first metal line, a second metal pattern formed into a second dielectric layer, the second metal pattern comprising a second metal line, the second dielectric layer being disposed on said first dielectric layer, and a via connecting the first metal line of the first metal pattern to the second metal line of the second metal pattern, wherein a top portion of the via is offset from a bottom portion of the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first dielectric layer;
a second dielectric layer disposed over the first dielectric layer;
a first metal feature disposed in the first dielectric layer;
a second metal feature disposed in the second dielectric layer;
a conductive via connecting the first metal feature to the second metal feature, wherein a top portion of the conductive via is offset from a bottom portion of the via; and
a polymeric feature disposed in the first dielectric layer, wherein a top surface of the polymeric feature is coplanar with an interface between the first dielectric layer and the second dielectric layer.

2. The device of claim 1, wherein the first metal feature, the second metal feature and the conductive via are formed of the same material.

3. The device of claim 1, further comprising a third metal feature disposed in the first dielectric layer, and
wherein the polymeric feature is disposed over the third metal feature.

4. The device of claim 3, wherein the polymeric feature physically contacts the third metal feature.

5. The device of claim 1, wherein the first dielectric layer is formed of a different dielectric material than the second dielectric layer.

6. The device of claim 1, wherein the top portion of the conductive via is disposed within the second dielectric layer and the bottom portion of the conductive via is disposed within the first dielectric layer.

7. The device of claim 1, wherein the top portion of the conductive via has a bottommost surface physically contacting the first dielectric layer and wherein the bottom portion of the conductive via has a topmost surface physically contacting the second dialectic layer.

8. The device of claim 7, wherein the bottommost surface of the top portion of the conductive via is coplanar with the topmost surface of the bottom portion of the conductive via.

9. A device comprising:
a first dielectric layer;
a second dielectric layer disposed over the first dielectric layer, the second dielectric layer being formed of a different material than the first dielectric layer;
a first metal feature disposed in the first dielectric layer;
a second metal feature disposed in the first dielectric layer;
a third metal feature disposed in the second dielectric layer;
a conductive via connecting the first metal feature to the third metal feature; and
a polymeric feature disposed directly on the second metal feature in the first dielectric layer, wherein a top surface of the polymeric feature is coplanar with an interface between the first dielectric layer and the second dielectric layer.

10. The device of claim 9, wherein a top portion of the conductive via is offset from a bottom portion of the via.

11. The device of claim 9, wherein the first metal feature is isolated from the second metal feature by the first dielectric layer.

12. The device of claim 9, wherein the second metal feature has a top surface, and
wherein the polymeric feature covers the entire top surface of the second metal feature.

13. The device of claim 9, wherein the first metal feature has a first length and first thickness, and
wherein the third metal feature has a second length and a second thickness, wherein the second length is greater than the first length.

14. The device f claim 9, wherein the second metal feature has a bottom surface coplanar with a bottom surface of the first metal feature.

15. The device of claim 9, wherein the conductive via includes a first surface interfacing with the first dielectric layer, and wherein the conductive via includes a second surface interfacing with the second dielectric layer.

16. A device comprising:

a first dielectric layer;

a second dielectric layer disposed over the first dielectric layer, the second dielectric layer being formed of a different material than the first dielectric layer;

a first conductive feature disposed in the first dielectric layer;

a second conductive feature disposed in the second dielectric layer;

a conductive via extending from the first conductive feature to the second conductive feature, the conductive via include a first set of opposing sidewalls and a second set of opposing sidewalls that are offset from the first set of opposing sidewalls; and a polymeric feature disposed in the first dielectric layer, wherein a top surface of the polymeric feature is coplanar with an interface between the first dielectric layer and the second dielectric layer.

17. The device of claim 16, wherein the first set of opposing sidewalls of the conductive via are disposed within the first dielectric layer, and wherein the second set of opposing sidewalls of the conductive via are disposed within the second dielectric layer.

18. The device of claim 16, wherein a first edge of the conductive via extends from one of the sidewall of the first set to one of the sidewalls of the second set, and wherein the edge extends along the interface between the first dielectric layer and the second dielectric layer.

19. The device of claim 16, wherein the first conductive feature and the second conductive feature includes a metal material.

20. The device of claim 16 wherein a bottom surface of the polymeric feature is coplanar with an interface between the conductive via and the first conductive feature.

* * * * *